US012289389B2

(12) United States Patent
Manevich et al.

(10) Patent No.: US 12,289,389 B2
(45) Date of Patent: Apr. 29, 2025

(54) PHYSICAL LAYER SYNTONIZATION USING DIGITALLY CONTROLLED OSCILLATOR

(71) Applicant: Mellanox Technologies, Ltd., Yokneam (IL)

(72) Inventors: Natan Manevich, Nesher (IL); Dotan David Levi, Kiryat Motzkin (IL); Arnon Sattinger, Zichron Yaakov (IL); Wojciech Waśko, Młynek (PL); Maciej Machnikowski, Reda (PL); Doron Fael, Zichron Yaakov (IL); Ofir Sadeh, Shoham (IL); Jonathan Oliel, Ramat Gan (IL)

(73) Assignee: Mellanox Technologies, Ltd., Yokneam (IL)

(*) Notice: Subject to any disclaimer, the term of this patent is extended or adjusted under 35 U.S.C. 154(b) by 36 days.

(21) Appl. No.: 18/448,936

(22) Filed: Aug. 13, 2023

(65) Prior Publication Data

US 2025/0055668 A1    Feb. 13, 2025

(51) Int. Cl.
*H04L 7/033* (2006.01)
*H03L 7/099* (2006.01)
*H04L 7/10* (2006.01)

(52) U.S. Cl.
CPC ............ *H04L 7/033* (2013.01); *H03L 7/0992* (2013.01); *H04L 7/10* (2013.01)

(58) Field of Classification Search
CPC .......... H04L 7/033; H04L 7/10; H03L 7/0992
See application file for complete search history.

(56) References Cited

U.S. PATENT DOCUMENTS

| 5,392,421 A | 2/1995 | Lennartsson |
| 5,402,394 A | 3/1995 | Turski |
| 5,416,808 A | 5/1995 | Witsaman et al. |
| 5,491,792 A | 2/1996 | Grisham et al. |
| 5,564,285 A | 10/1996 | Jurewicz et al. |
| 5,592,486 A | 1/1997 | Lo et al. |
| 5,896,524 A | 4/1999 | Halstead, Jr. et al. |
| 6,055,246 A | 4/2000 | Jones |

(Continued)

FOREIGN PATENT DOCUMENTS

| CN | 101059825 A | 10/2007 |
| CN | 101388741 A | 3/2009 |

(Continued)

OTHER PUBLICATIONS

U.S. Appl. No. 17/313,026 Office Action dated Dec. 19, 2023.

(Continued)

*Primary Examiner* — Janice N Tieu
(74) *Attorney, Agent, or Firm* — Meitar Patents Ltd.; Daniel Kligler

(57) ABSTRACT

In one embodiment, a system includes a digitally controlled oscillator (DCO) to generate a local clock having a local clock frequency, and clock synchronization circuitry to receive from a device a signal indicative of a remote clock frequency, compare measures of the remote clock frequency and the local clock frequency; generate a digital control command based on the comparison; and provide the digital control command to the DCO, wherein the DCO is to adjust the local clock frequency responsively to the digital control command.

25 Claims, 3 Drawing Sheets

(56) References Cited

U.S. PATENT DOCUMENTS

| | | | |
|---|---|---|---|
| 6,081,143 A * | 6/2000 | Ho | G06F 1/12 331/11 |
| 6,084,856 A | 7/2000 | Simmons et al. | |
| 6,144,714 A | 11/2000 | Bleiweiss et al. | |
| 6,199,169 B1 | 3/2001 | Voth | |
| 6,289,023 B1 | 9/2001 | Dowling et al. | |
| 6,449,291 B1 | 9/2002 | Burns et al. | |
| 6,535,926 B1 | 3/2003 | Esker | |
| 6,556,636 B1 | 4/2003 | Takagi | |
| 6,556,638 B1 | 4/2003 | Blackburn | |
| 6,718,476 B1 | 4/2004 | Shima | |
| 6,918,049 B2 | 7/2005 | Lamb et al. | |
| 7,111,184 B2 | 9/2006 | Thomas, Jr. et al. | |
| 7,191,354 B2 | 3/2007 | Purho | |
| 7,245,627 B2 | 7/2007 | Goldenberg et al. | |
| 7,254,646 B2 | 8/2007 | Aguilera et al. | |
| 7,334,124 B2 | 2/2008 | Pham et al. | |
| 7,412,475 B1 | 8/2008 | Govindarajalu | |
| 7,440,474 B1 | 10/2008 | Goldman et al. | |
| 7,447,975 B2 | 11/2008 | Riley | |
| 7,483,448 B2 | 1/2009 | Bhandari et al. | |
| 7,496,686 B2 | 2/2009 | Coyle | |
| 7,535,933 B2 | 5/2009 | Zerbe et al. | |
| 7,623,552 B2 | 11/2009 | Jordan et al. | |
| 7,636,767 B2 | 12/2009 | Lev-Ran et al. | |
| 7,650,158 B2 | 1/2010 | Indirabhai | |
| 7,656,751 B2 | 2/2010 | Rischar et al. | |
| 7,750,685 B1 | 7/2010 | Bunch et al. | |
| 7,904,713 B1 | 3/2011 | Zajkowski et al. | |
| 7,941,684 B2 | 5/2011 | Serebrin et al. | |
| 8,065,052 B2 | 11/2011 | Fredriksson et al. | |
| 8,072,313 B2 | 12/2011 | Drucker | |
| 8,300,749 B2 | 10/2012 | Hadzic et al. | |
| 8,341,454 B1 | 12/2012 | Kondapalli | |
| 8,370,675 B2 | 2/2013 | Kagan | |
| 8,407,478 B2 | 3/2013 | Kagan et al. | |
| 8,607,086 B2 | 12/2013 | Cullimore | |
| 8,693,506 B2 | 4/2014 | Hadzic | |
| 8,699,406 B1 | 4/2014 | Charles et al. | |
| 8,824,903 B2 | 9/2014 | Christensen | |
| 8,879,552 B2 | 11/2014 | Zheng | |
| 8,930,647 B1 | 1/2015 | Smith | |
| 9,344,265 B2 | 5/2016 | Karnes | |
| 9,397,960 B2 | 7/2016 | Arad et al. | |
| 9,549,234 B1 | 1/2017 | Mascitto | |
| 9,753,854 B1 | 9/2017 | Bao | |
| 9,942,025 B2 | 4/2018 | Bosch et al. | |
| 9,979,998 B1 | 5/2018 | Pogue et al. | |
| 10,014,937 B1 | 7/2018 | Di Mola et al. | |
| 10,027,601 B2 | 7/2018 | Narkis et al. | |
| 10,054,977 B2 | 8/2018 | Mikhaylov et al. | |
| 10,095,543 B1 | 10/2018 | Griffin et al. | |
| 10,122,527 B1 | 11/2018 | Fischer | |
| 10,148,258 B2 | 12/2018 | Carlson et al. | |
| 10,164,759 B1 | 12/2018 | Volpe | |
| 10,320,646 B2 | 6/2019 | Mirsky et al. | |
| 10,515,045 B1 | 12/2019 | Mattina | |
| 10,637,776 B2 | 4/2020 | Iwasaki | |
| 10,727,966 B1 | 7/2020 | Izenberg et al. | |
| 10,778,361 B1 | 9/2020 | Almog et al. | |
| 10,778,406 B2 | 9/2020 | Gaist et al. | |
| 10,785,015 B1 | 9/2020 | Rada | |
| 10,841,243 B2 | 11/2020 | Levi et al. | |
| 10,879,910 B1 | 12/2020 | Franck et al. | |
| 10,887,077 B1 | 1/2021 | Ivry | |
| 10,908,635 B1 | 2/2021 | Ranganathan et al. | |
| 11,070,224 B1 | 7/2021 | Faig et al. | |
| 11,070,304 B1 | 7/2021 | Levi et al. | |
| 11,128,500 B1 | 9/2021 | Mentovich et al. | |
| 11,157,433 B2 | 10/2021 | Lederman et al. | |
| 11,240,079 B1 | 2/2022 | Kushnir et al. | |
| 11,303,363 B1 | 4/2022 | Mohr et al. | |
| 11,336,383 B2 | 5/2022 | Mula et al. | |
| 11,368,768 B2 | 6/2022 | Bakopoulos et al. | |
| 11,379,334 B1 | 7/2022 | Srinivasan et al. | |
| 11,388,263 B2 | 7/2022 | Levi et al. | |
| 11,476,928 B2 | 10/2022 | Levi et al. | |
| 11,606,157 B1 | 3/2023 | Wasko et al. | |
| 11,706,014 B1 | 7/2023 | Manevich et al. | |
| 2001/0006500 A1 | 7/2001 | Nakajima et al. | |
| 2002/0027886 A1 | 3/2002 | Fischer et al. | |
| 2002/0031199 A1 | 3/2002 | Rolston et al. | |
| 2004/0096013 A1 | 5/2004 | Laturell et al. | |
| 2004/0153907 A1 | 8/2004 | Gibart | |
| 2005/0033947 A1 | 2/2005 | Morris et al. | |
| 2005/0172181 A1 | 8/2005 | Huliehel | |
| 2005/0268183 A1 | 12/2005 | Barmettler | |
| 2006/0109376 A1 | 5/2006 | Chaffee et al. | |
| 2006/0171496 A1 | 8/2006 | Nakamuta et al. | |
| 2007/0008044 A1 | 1/2007 | Shimamoto | |
| 2007/0072451 A1 | 3/2007 | Tazawa et al. | |
| 2007/0104098 A1 | 5/2007 | Kimura et al. | |
| 2007/0124415 A1 | 5/2007 | Lev-Ran et al. | |
| 2007/0139085 A1 | 6/2007 | Elliot et al. | |
| 2007/0159924 A1 | 7/2007 | Vook et al. | |
| 2007/0266119 A1 | 11/2007 | Ohly | |
| 2008/0069150 A1 | 3/2008 | Badt et al. | |
| 2008/0225841 A1 | 9/2008 | Conway et al. | |
| 2008/0285597 A1 | 11/2008 | Downey et al. | |
| 2009/0167443 A1 | 7/2009 | Liu et al. | |
| 2009/0257458 A1 | 10/2009 | Cui et al. | |
| 2010/0280858 A1 | 11/2010 | Bugenhagen | |
| 2011/0110360 A1 | 5/2011 | Fenwick et al. | |
| 2011/0182191 A1 | 7/2011 | Jackson | |
| 2011/0194425 A1 | 8/2011 | Li et al. | |
| 2012/0063556 A1 | 3/2012 | Hoang | |
| 2012/0076319 A1 | 3/2012 | Terwal | |
| 2012/0301134 A1 | 11/2012 | Davari et al. | |
| 2013/0039359 A1 | 2/2013 | Bedrosian | |
| 2013/0045014 A1 | 2/2013 | Mottahedin et al. | |
| 2013/0215889 A1 | 8/2013 | Zheng et al. | |
| 2013/0235889 A1 | 9/2013 | Aweya et al. | |
| 2013/0294144 A1 | 11/2013 | Wang et al. | |
| 2013/0315265 A1 | 11/2013 | Webb, III et al. | |
| 2013/0336435 A1 | 12/2013 | Akkihal et al. | |
| 2014/0085141 A1 | 3/2014 | Geva et al. | |
| 2014/0153680 A1 | 6/2014 | Garg et al. | |
| 2014/0185216 A1 | 7/2014 | Zeng et al. | |
| 2014/0185632 A1 | 7/2014 | Steiner et al. | |
| 2014/0253387 A1 | 9/2014 | Gunn et al. | |
| 2014/0281036 A1 | 9/2014 | Cutler et al. | |
| 2014/0301221 A1 | 10/2014 | Nadeau et al. | |
| 2014/0321285 A1 | 10/2014 | Chew et al. | |
| 2015/0019839 A1 | 1/2015 | Cardinell et al. | |
| 2015/0078405 A1 | 3/2015 | Roberts | |
| 2015/0092793 A1 | 4/2015 | Aweya | |
| 2015/0127978 A1 | 5/2015 | Cui et al. | |
| 2015/0131766 A1 * | 5/2015 | Chen | H03L 7/087 375/372 |
| 2015/0163050 A1 | 6/2015 | Han et al. | |
| 2015/0318941 A1 | 11/2015 | Zheng et al. | |
| 2016/0057518 A1 | 2/2016 | Neudorf | |
| 2016/0072602 A1 | 3/2016 | Earl et al. | |
| 2016/0110211 A1 | 4/2016 | Karnes | |
| 2016/0140066 A1 | 5/2016 | Worrell et al. | |
| 2016/0277138 A1 | 9/2016 | Garg et al. | |
| 2016/0285574 A1 | 9/2016 | White et al. | |
| 2016/0315756 A1 | 10/2016 | Tenea et al. | |
| 2017/0005903 A1 | 1/2017 | Mirsky | |
| 2017/0017604 A1 | 1/2017 | Chen et al. | |
| 2017/0126589 A1 | 5/2017 | Estabrooks et al. | |
| 2017/0160933 A1 | 6/2017 | De Jong et al. | |
| 2017/0214516 A1 | 7/2017 | Rivaud et al. | |
| 2017/0302392 A1 | 10/2017 | Farra et al. | |
| 2017/0331926 A1 | 11/2017 | Raveh et al. | |
| 2017/0359137 A1 | 12/2017 | Butterworth et al. | |
| 2018/0059167 A1 | 3/2018 | Sharf et al. | |
| 2018/0152286 A1 | 5/2018 | Kemparaj et al. | |
| 2018/0188698 A1 | 7/2018 | Dionne et al. | |
| 2018/0191802 A1 | 7/2018 | Yang et al. | |
| 2018/0227067 A1 | 8/2018 | Hu et al. | |
| 2018/0309654 A1 | 10/2018 | Achkir et al. | |
| 2019/0007189 A1 | 1/2019 | Hossain et al. | |
| 2019/0014526 A1 | 1/2019 | Bader et al. | |

(56) References Cited

U.S. PATENT DOCUMENTS

| | | |
|---|---|---|
| 2019/0089615 A1 | 3/2019 | Branscomb et al. |
| 2019/0149258 A1 | 5/2019 | Araki et al. |
| 2019/0158909 A1 | 5/2019 | Kulkarni et al. |
| 2019/0196563 A1 | 6/2019 | Lai |
| 2019/0220300 A1 | 7/2019 | Rosenboom |
| 2019/0265997 A1 | 8/2019 | Merrill et al. |
| 2019/0273571 A1 | 9/2019 | Bordogna et al. |
| 2019/0319729 A1 | 10/2019 | Leong et al. |
| 2019/0349392 A1 | 11/2019 | Wetterwald et al. |
| 2019/0379714 A1 | 12/2019 | Levi et al. |
| 2020/0044657 A1 | 2/2020 | Pi et al. |
| 2020/0162234 A1 | 5/2020 | Almog et al. |
| 2020/0235905 A1 | 7/2020 | Su et al. |
| 2020/0287557 A1* | 9/2020 | Horovitz ............... H03L 7/10 |
| 2020/0304224 A1 | 9/2020 | Neugeboren |
| 2020/0331480 A1 | 10/2020 | Zhang et al. |
| 2020/0344333 A1 | 10/2020 | Hawari et al. |
| 2020/0396050 A1 | 12/2020 | Perras et al. |
| 2020/0401434 A1 | 12/2020 | Thampi et al. |
| 2021/0006344 A1 | 1/2021 | Chen et al. |
| 2021/0141413 A1 | 5/2021 | Levi et al. |
| 2021/0175991 A1 | 6/2021 | Neugeboren |
| 2021/0218431 A1 | 7/2021 | Narayanan et al. |
| 2021/0243140 A1 | 8/2021 | Levi et al. |
| 2021/0288785 A1 | 9/2021 | Faig et al. |
| 2021/0297151 A1 | 9/2021 | Levi et al. |
| 2021/0297230 A1 | 9/2021 | Dror et al. |
| 2021/0318978 A1 | 10/2021 | Hsung |
| 2021/0328900 A1 | 10/2021 | Sattinger et al. |
| 2021/0392065 A1 | 12/2021 | Sela et al. |
| 2021/0409031 A1 | 12/2021 | Ranganathan et al. |
| 2022/0006606 A1 | 1/2022 | Levi et al. |
| 2022/0021393 A1 | 1/2022 | Ravid et al. |
| 2022/0066978 A1 | 3/2022 | Mishra et al. |
| 2022/0086105 A1 | 3/2022 | Levi et al. |
| 2022/0173741 A1 | 6/2022 | Ravid et al. |
| 2022/0191275 A1 | 6/2022 | Levi et al. |
| 2022/0121691 A1 | 7/2022 | Mentovich et al. |
| 2022/0224500 A1 | 7/2022 | Mula et al. |
| 2022/0239549 A1 | 7/2022 | Zhao et al. |
| 2022/0261032 A1 | 8/2022 | Bateni |
| 2022/0342086 A1 | 10/2022 | Yoshida |
| 2022/0352998 A1 | 11/2022 | Levi et al. |
| 2022/0357763 A1 | 11/2022 | Levy et al. |
| 2022/0360423 A1 | 11/2022 | Levi et al. |
| 2022/0385598 A1 | 12/2022 | Pismenny et al. |
| 2022/0416925 A1 | 12/2022 | Levi et al. |
| 2023/0076889 A1 | 3/2023 | Rabinovich et al. |
| 2023/0185600 A1 | 6/2023 | Wasko et al. |
| 2023/0236624 A1 | 7/2023 | Levi et al. |
| 2023/0251899 A1 | 8/2023 | Levi et al. |
| 2023/0361900 A1 | 11/2023 | Levi et al. |
| 2023/0362096 A1 | 11/2023 | Manevich et al. |

FOREIGN PATENT DOCUMENTS

| | | |
|---|---|---|
| CN | 106817183 A | 6/2017 |
| CN | 108667547 A | 10/2018 |
| CN | 108829493 A | 11/2018 |
| EP | 1215559 B1 | 9/2007 |
| EP | 2770678 A1 | 8/2014 |
| JP | 2011091676 A | 5/2011 |
| TW | 498259 B | 8/2002 |
| WO | 2012007276 A1 | 1/2012 |
| WO | 2013124782 A2 | 8/2013 |
| WO | 2013143112 A1 | 10/2013 |
| WO | 2014029533 A1 | 2/2014 |
| WO | 2014138936 A1 | 9/2014 |

OTHER PUBLICATIONS

Zhang et al., "TI BAW technology enables ultra-low jitter clocks for highspeed networks", White paper, Texas Instruments, pp. 1-11, Feb. 2019.

Skywork Solutions Inc., "PCI Express 3.1 Jitter Requirements", AN562, pp. 1-16, year 2021.

Intel, "Can Altera GX/GT/GZ device high speed transceivers handle Spread Spectrum Clocking (SSC), as required py PCIe or SATA/SAS protocols?", p. 1, Sep. 11, 2012.

Shapira et al., U.S. Appl. No. 17/534,776, filed Nov. 24, 2021.

Shapira et al., U.S. Appl. No. 17/578,115, filed Jan. 18, 2022.

Kernen et al., U.S. Appl. No. 17/858,236, filed Jul. 6, 2022.

Manevich et al., U.S. Appl. No. 17/885,604, filed Aug. 11, 2022.

Manevich et al., U.S. Appl. No. 18/067,767, filed Dec. 19, 2022.

"IEEE Standard for Local and Metropolitan Area Networks—Timing and Synchronization for Time-Sensitive Applications," IEEE Std 802.1AS-2020, IEEE Computer Society, pp. 1-421, year 2020.

U.S. Appl. No. 17/871,937 Office Action dated Aug. 1, 2023.

U.S. Appl. No. 17/578,115 Office Action dated Apr. 26, 2023.

U.S. Appl. No. 17/534,776 Office Action dated Jun. 29, 2023.

SiTime Corporation, "Sit5377—60 to 220 MHz, ±100 ppb Elite RF™ Super-TCXO," Product Description, pp. 1-3, last updated Mar. 18, 2023 as downloaded from https://web.archive.org/web/20230318094421/https://www.sitime.com/products/super-tcxos/sit5377.

PCI-SIG, "PCI Express®—Base Specification—Revision 3.0," pp. 1-860, Nov. 10, 2010.

U.S. Appl. No. 17/191,736 Office Action dated Jun. 26, 2023.

Corbett et al., "Spanner: Google's Globally Distributed Database," ACM Transactions on Computer Systems, vol. 31, No. 3, article 8, pp. 1-22, Aug. 2013.

Wasko et al., U.S. Appl. No. 18/111,916, filed Feb. 21, 2023.

Manevich et al., U.S. Appl. No. 18/349,976, filed Jul. 11, 2023.

IEEE Standard 1588™-2008: "IEEE Standard for a Precision Clock Synchronization Protocol for Networked Measurement and Control Systems", IEEE Instrumentation and Measurement Society, Revision of IEEE Standard 1588-2002, USA, pp. 1-289, Jul. 24, 2008.

Weibel et al., "Implementation and Performance of Time Stamping Techniques", 2004 Conference on IEEE 1588, pp. 1-29, Sep. 28, 2004.

Working Draft Project American National Standard T10/1799-D, "Information Technology—SCSI Block Commands—3 (SBC-3)", pp. 1-220, Revision 19, May 29, 2009.

"Infiniband Architecture: Specification vol. 1", pp. 1-1727, Release 1.2.1, Infiniband Trade Association, Nov. 2007.

Mellanox Technologies, "Mellanox ConnectX IB: Dual-Port InfiniBand Adapter Cards with PCI Express 2.0", pp. 1-2, USA, year 2008.

Wikipedia—"Precision Time Protocol", pp. 1-8, Aug. 24, 2019.

IEEE Std 1588-2002, "IEEE Standard for a Precision Clock Synchronization Protocol for Networked Measurement and Control Systems", IEEE Instrumentation and Measurement Society, pp. 1-154, Nov. 8, 2002.

Weibel, H., "High Precision Clock Synchronization according to IEEE 1588 Implementation and Performance Issues", Zurich University of Applied Sciences, pp. 1-9, Jan. 17, 2005.

Lu et al., "A Fast CRC Update Implementation", Computer Engineering Laboratory, Electrical Engineering Department, pp. 113-120, Oct. 8, 2003.

Texas Instruments, "LMK05318 Ultra-Low Jitter Network Synchronizer Clock With Two Frequency Domains," Product Folder, pp. 1-86, Dec. 2018.

Dlugy-Hegwer et al., "Designing and Testing IEEE 1588 Timing Networks", Symmetricom, pp. 1-10, Jan. 2007.

Mellanox Technologies, "How to test 1PPS on Mellanox Adapters", pp. 1-6, Oct. 22, 2019 downloaded from https://community.mellanox.com/s/article/How-To-Test-1PPS-on-Mellanox-Adapters.

ITU-T recommendation, "G.8273.2/Y.1368.2—Timing characteristics of telecom boundary clocks and telecom time slave clocks", pp. 1-50, Jan. 2017.

Evi et al., U.S. Appl. No. 17/871,937, filed Jul. 24, 2022.

Ipclock, "IEEE 1588 Primer," ip-clock.com, pp. 1-3, May 1, 2017 (downloaded from https://web.archive.org/web/20170501192647/http://ip-clock.com/ieee-1588-primer/).

ITU-T Standard G.8261/Y.1361, "Timing and synchronization aspects in packet networks", pp. 1-120, Aug. 2019.

Levi et al., U.S. Appl. No. 17/868,841, filed Jul. 20, 2022.

(56) References Cited

OTHER PUBLICATIONS

"Precision Time Protocol," PTP Clock Types, Cisco, pp. 1-52, Jul. 30, 2020, as downloaded from https://www.cisco.com/c/en/us/td/docs/dcn/aci/apic/5x/system-management-configuration/cisco-apic-system-management-configuration-guide-52x/m-precision-time-protocol.pdf.

ITU-T Standard G.8262/Y.1362, "Timing characteristics of synchronous equipment slave clock", pp. 1-44, Nov. 2018.

ITU-T Standard G.8264/Y.1364, "Distribution of timing information through packet networks", pp. 1-42, Aug. 2017.

Manevich et al., U.S. Appl. No. 17/867,779, filed Jul. 19, 2022.

CN Application # 202210456108.6 Office Action dated Aug. 30, 2024.

U.S. Appl. No. 18/111,916 Office Action dated Jun. 5, 2024.

Obleukhov et al., "Simple Precision Time Protocol at Meta," pp. 1-15, Feb. 7, 2024, as downloaded from https://engineering.fb.com/2024/02/07/production-engineering/simple-precision-time-protocol-sptp-meta/.

Behn, "meinberg-sync / flashptpd," Meinberg Funkuhren GmbH & Co. KG, pp. 1-6, year 2023.

Arnold et al., "Enterprise Profile for the Precision Time Protocol with Mixed Multicast and Unicast Messages," Internet Engineering Task Force (IETF), Tictoc Workgroup, Internet Draft, pp. 1-13, Nov. 23, 2023.

Wikipedia, "Network Time Protocol," pp. 1-20, last edited Mar. 31, 2024.

Silicon Laboratories Inc., "Temperature-Compensated Oscillator Example," AN365, Rev. 0.1, pp. 1-8, Nov. 9, 2009.

Sutton et al., "Reinforcement Learning," Chapter 6.6—"Actor-Critic Methods," The MIT Press, e-book, pp. 1-3, Jan. 4, 2005, as downloaded from incompleteideas.net/book/first/ebook/node66.html.

ITU-T Recommendation, "G.8262.1/Y.1362.1—Series G: Transmission Systems and Media, Digital Systems and Networks—Packet over Transport Aspects—Synchronization, Quality and Availability Targets Series Y: Global Information Infrastructure, Internet Protocol Aspects, Next-Generation Networks, Internet of Things and Smart Cities—Timing Characteristics of Enhanced Synchronous Equipment Slave Clock," pp. 1-26, Jan. 2019.

\* cited by examiner

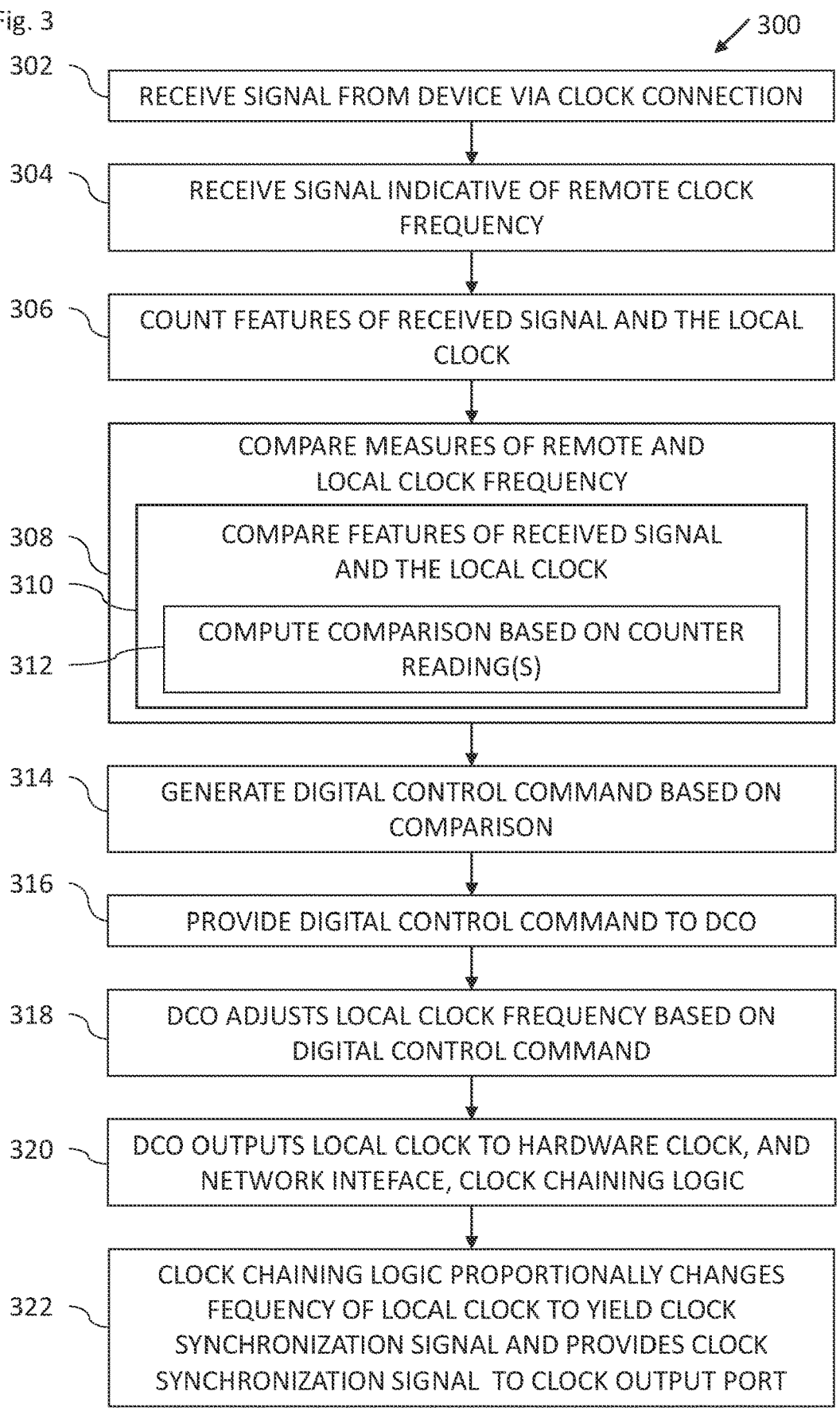

PHYSICAL LAYER SYNTONIZATION USING DIGITALLY CONTROLLED OSCILLATOR

FIELD OF THE INVENTION

The present invention relates to computer systems, and in particular, but not exclusively to, clock syntonization.

BACKGROUND

Clock synchronization among network devices is used in many network applications. One application of using a synchronized clock value is for measuring one-way latency from one device to another device. If the clocks are not synchronized the resulting one-way latency measurement will be inaccurate.

Synchronization is typically achieved by syntonization, in which the clock frequency of two devices is aligned, and aligning the phase between the two devices.

For Ethernet, there are two complementary methods to achieve synchronization. One is Synchronous Ethernet (SyncE), which is a physical-layer protocol which achieves syntonization based on the receive/transmit symbol rate. SyncE is an International Telecommunication Union Telecommunication (ITU-T) Standardization Sector standard for computer networking that facilitates the transference of clock signals over the Ethernet physical layer. In particular, SyncE enables clock syntonization inside a network with respect to a master clock.

The other is Precision Time Protocol (PTP), which is a packet-based protocol that may be used with SyncE to align offset (e.g., in Coordinated Universal Time (UTC) format) and phase between two clocks. It should be noted that PTP may be used alone over Ethernet (without SyncE), but this is typically used for lower accuracy use cases. PTP is used to synchronize clocks throughout a computer network, and is considered to be the de facto standard for this purpose.

Time, clock, and frequency synchronization are crucial in some modern computer network applications. It enables 5G and 6G networks, and is proven to enhance the performance of data center workloads.

SUMMARY

There is provided in accordance with an embodiment of the present disclosure, a system, including a digitally controlled oscillator (DCO) to generate a local clock having a local clock frequency, and clock synchronization circuitry to receive from a device a signal indicative of a remote clock frequency, compare measures of the remote clock frequency and the local clock frequency, generate a digital control command based on the comparison, and provide the digital control command to the DCO, wherein the DCO is to adjust the local clock frequency responsively to the digital control command.

Further in accordance with an embodiment of the present disclosure digital control command indicates a new clock frequency to which to change the local clock frequency by the DCO.

Still further in accordance with an embodiment of the present disclosure digital control command indicates a frequency adjustment to be made by the DCO to the local clock frequency.

Additionally in accordance with an embodiment of the present disclosure, the system includes a network interface to receive the signal including first packets from the device over a network and transmit a signal including second packets over the network, the clock synchronization circuitry is to compare a symbol rate of the received signal to a symbol rate of the transmitted signal to provide the comparison of the remote clock frequency and the local clock frequency.

Moreover, in accordance with an embodiment of the present disclosure, the system includes multiple chips, wherein the network interface and the clock synchronization circuitry are distributed among the multiple chips.

Further in accordance with an embodiment of the present disclosure the clock synchronization circuitry includes at least one counter in which the clock synchronization circuitry is to count symbols of the received signal and the transmitted signal in a time window, the clock synchronization circuitry is to run firmware to compute the comparison of the remote clock frequency and the local clock frequency based on at least one symbol count of the at least one counter.

Still further in accordance with an embodiment of the present disclosure, the system includes a clock input port to receive the signal from the device via a clock connection, the clock synchronization circuitry is configured to compare features of the received signal and the local clock to provide the comparison of the remote clock frequency and the local clock frequency.

Additionally in accordance with an embodiment of the present disclosure the clock synchronization circuitry includes clock chaining logic which includes at least one counter in which the clock chaining logic is to count the features of the received signal and the local clock in a time window, the clock synchronization circuitry being to run firmware to compute the comparison of the remote clock frequency and the local clock frequency based on at least one count value of the at least one counter.

Moreover, in accordance with an embodiment of the present disclosure, the system includes a clock output port to provide a clock synchronization signal to another device via another clock connection.

Further in accordance with an embodiment of the present disclosure the clock chaining logic is to proportionally change a frequency of the local clock to yield the clock synchronization signal, and provide the clock synchronization signal to the clock output port for output to the other device via the other clock connection.

Still further in accordance with an embodiment of the present disclosure clock synchronization circuitry is to run firmware to compute the comparison of the remote clock frequency and the local clock frequency.

Additionally in accordance with an embodiment of the present disclosure, the system includes a hardware clock to maintain a time-of-day value advancing at a frequency proportional to the local clock frequency of the local clock output by the DCO, wherein the DCO is connected to the hardware clock and is to output the local clock towards the hardware clock.

Moreover, in accordance with an embodiment of the present disclosure, the system includes a network interface including ports to send packets over a network at a symbol rate based on a frequency proportional to the local clock frequency, wherein DCO is connected to the network interface and is to output the local clock towards the network interface.

There is also provided in accordance with another embodiment of the present disclosure, a method, including generating a local clock having a local clock frequency with a digitally controlled oscillator (DCO), receiving from a device a signal indicative of a remote clock frequency, comparing measures of the remote clock frequency and the local clock frequency, generating a digital control command based on the comparison, and provide the digital control command to the DCO, and adjusting the local clock frequency by the DCO responsively to the digital control command.

Further in accordance with an embodiment of the present disclosure digital control command indicates a new clock frequency to which to change the local clock frequency by the DCO.

Still further in accordance with an embodiment of the present disclosure digital control command indicates a frequency adjustment to be made by the DCO to the local clock frequency.

Additionally in accordance with an embodiment of the present disclosure the receiving includes receiving the signal including first packets from the device over a network, the method further including transmitting a signal including second packets over the network, the comparing includes comparing a symbol rate of the received signal to a symbol rate of the transmitted signal to provide the comparison of the remote clock frequency and the local clock frequency.

Moreover, in accordance with an embodiment of the present disclosure, the method includes counting symbols of the received signal and the transmitted signal in a time window using at least one counter, and running firmware to compute the comparison of the remote clock frequency and the local clock frequency based on at least one symbol count of the at least one counter.

Further in accordance with an embodiment of the present disclosure the receiving includes receiving the signal from the device via a clock connection, and the comparing includes comparing features of the received signal and the local clock to provide the comparison of the remote clock frequency and the local clock frequency.

Still further in accordance with an embodiment of the present disclosure, the method includes counting the features of the received signal and the local clock in a time window using at least one counter, and running firmware to compute the comparison of the remote clock frequency and the local clock frequency based on at least one count value of the at least one counter.

Additionally in accordance with an embodiment of the present disclosure, the method includes providing a clock synchronization signal to another device via another clock connection.

Moreover, in accordance with an embodiment of the present disclosure, the method includes proportionally changing a frequency of the local clock to yield the clock synchronization signal.

Further in accordance with an embodiment of the present disclosure, the method includes running firmware to compute the comparison of the remote clock frequency and the local clock frequency.

Still further in accordance with an embodiment of the present disclosure, the method includes maintaining a time-of-day value advancing at a frequency proportional to the local clock frequency of the local clock output by the DCO.

Additionally in accordance with an embodiment of the present disclosure, the method includes sending packets over a network at a symbol rate based on a frequency proportional to the local clock frequency of the local clock output by the DCO.

BRIEF DESCRIPTION OF THE DRAWINGS

The present invention will be understood from the following detailed description, taken in conjunction with the drawings in which:

FIG. 3 is a flowchart including steps in a method of operation of the system of FIG. 1 including synchronization to a remote clock frequency received from a chained device.

DESCRIPTION OF EXAMPLE EMBODIMENTS

Overview

Figure 1:
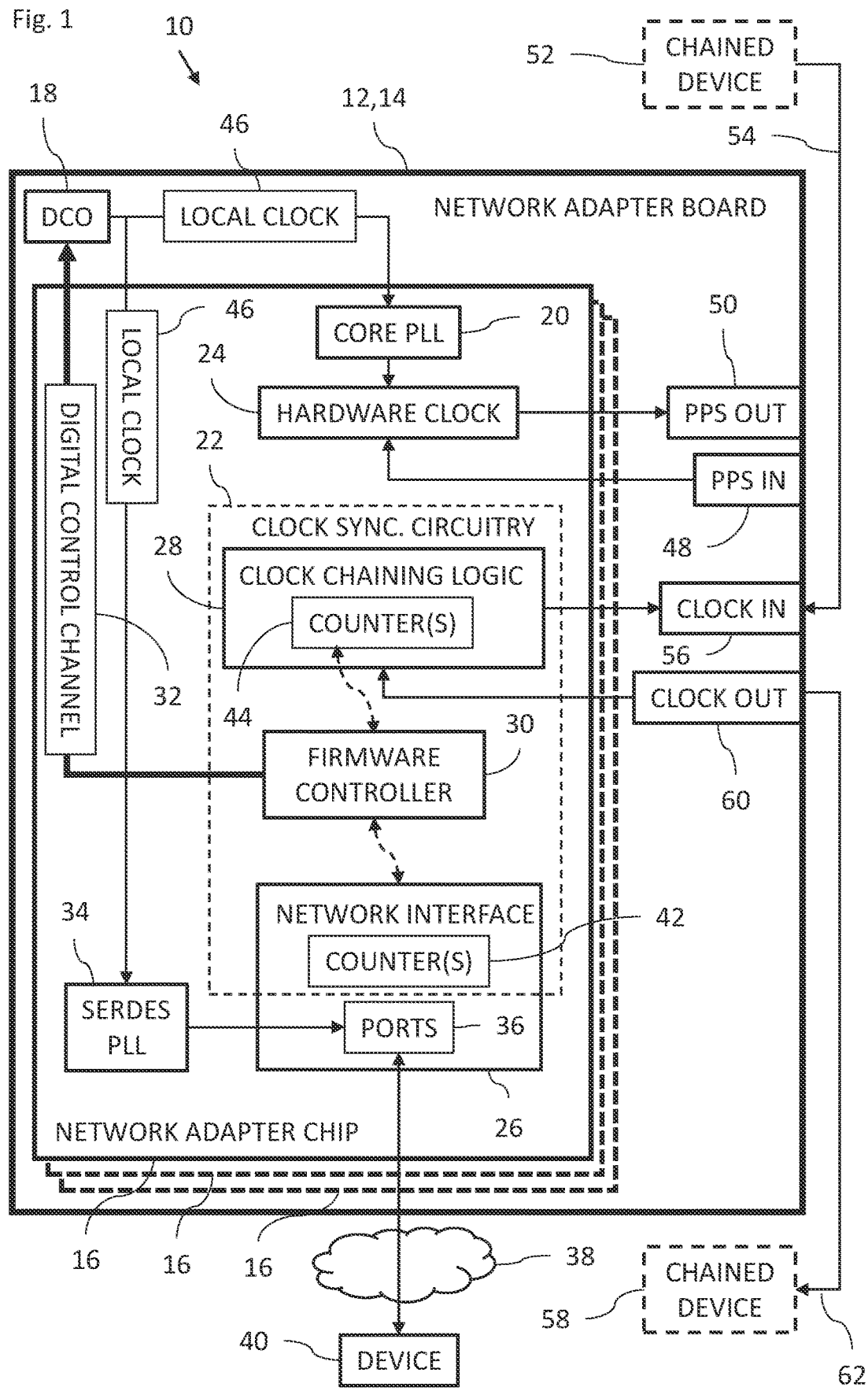
FIG. 1 is a block diagram view of a clock synchronization system constructed and operative in accordance with an embodiment of the present invention.

A local device may transmit data including symbols to a remote device at a rate equal to, or proportional to, its local clock frequency. The local device may also receive data including symbols from the remote device at a rate equal to, or proportional to, the clock frequency of the remote device. Therefore, if the remote device is a master clock for the local device, then the local device may syntonize to the master clock by determining if its local clock is faster or slower than the master clock based on a difference between its send symbol rate and receive symbol rate from the remote device and adjust the frequency of its local clock accordingly.

There are many challenges to overcome when designing a local clock which needs to be syntonized with a master clock. Some clocks may have low phase noise but have poor drift stability over time. Other clocks, such as temperature or oven compensated clocks may have good drift stability but suffer from phase noise issues.

Embodiments of the present invention address at least some of the above challenges by providing a local clock with low phase noise and good drift stability using a digitally controlled oscillator (DCO) which is controlled by a digital control command. The DCO may include a temperature compensated oscillator and generate an output frequency of around 156.25 MHz. Clock synchronization circuitry tracks the difference between the frequency of the local clock and a remote master clock (e.g., using one or more counters to count received and transmitted symbols in a time window) and instructs the DCO, using a digital control command, to increase or decrease the rate of the local clock based on the tracked difference. The local clock is then adjusted (iteratively) until the local clock is synchronized with the remote master clock.

In some embodiments, firmware running on a firmware controller may read the counter value(s) in order to determine whether the local clock is faster or slower than the remote master clock. The firmware then generates the digital control command, which is then provided to the DCO.

In some embodiments, the remote master clock may be received from a link partner over a network. In some embodiments, clock synchronization is implemented with a network device including a network interface controller (NIC) application specific integrated circuit (ASIC). The ASIC includes ports, clock synchronization circuitry including a firmware controller, and a hardware clock. The ASIC is mounted on a printed circuit board (PCB), which also includes the DCO. The firmware controller provides digital control commands to the DCO via a digital control channel connecting the ASIC with the DCO. The DCO then provides the local clock to the ports and the hardware clock on the ASIC via another connection from the DCO to the ASIC. In some embodiments, the firmware controller may be included in an integrated circuit, which is external to the NIC ASIC.

In some cases, the identity of the master clock may not be known and only becomes known after time. Therefore, the receive symbol rates of all the ports may be tracked by the clock synchronization circuitry (e.g., using multiple counters) and when the identity of the master clock is known the firmware determines whether the local clock is faster or slower than the remote master clock (e.g., based on using the value of the relevant counter of the relevant port receiving the remote master clock).

In some embodiments, the network device may include multiple NIC ASICs, with each ASIC including ports and clock synchronization circuitry. The ASICs are mounted on a PCB with the DCO and firmware controller. The firmware controller identifies the port receiving the remote master clock from among the ports on the different ASICs and determines whether the local clock is faster or slower than the remote master clock and generates a digital control command and provides the digital control command to the DCO to adjust the frequency of the local clock. The local clock is provided to the ports on each of the ASICs and to the hardware clocks on each of the ASICs.

In some embodiments, the remote master clock may be received from a device connected via a clock connection, e.g., a clock cable or a printed circuit board (PCB) trace. Similarly, a clock synchronization signal based on the local clock may be generated and provided to another device connected to the local device via another clock connection, e.g., a clock cable or a PCB trace.

System Description

Reference is now made to FIG. 1, which is a block diagram view of a clock synchronization system 10 constructed and operative in accordance with an embodiment of the present invention.

The clock synchronization system 10 includes a device 12. In the example of FIG. 1, the device 12 is a network device including a network adapter board 14 (e.g., PCB) and one or more network adapter chips 16, e.g., NIC ASICs mounted on the network adapter board 14. The device 12 may be implemented as any suitable processing device, for example, a device including a CPU and/or a GPU.

The device 12 includes a digitally controller oscillator (DCO) 18 mounted on the network adapter board 14. The DCO 18 is configured to generate a local clock 46 having a local clock frequency. SiT5377 is a ±100 ppb precision MEMS Super-TCXO and is suitable for use as DTO 18. SiT5377 is commercially available from SiTime Corporation.

The network adapter board 14 (or each network adapter board 14) may include any one or more of the following: a core phase-locked loop (PLL) 20, clock synchronization circuitry 22, a hardware clock 24, a network interface 26, clock chaining logic 28, a firmware controller 30, a digital control channel 32, and a serializer/deserializer (SerDes) PLL 34. The network interface 26 may include one or more ports 36 to receive and/or transmit packets over a network 38 from/to one or more remote devices 40 (only one shown for the sake of simplicity). The network interface 26 may also include one or more counters 42 in which to count symbols sent and received by the ports 36 described in more detail with reference to FIG. 2. The clock chaining logic 28 may also include one or more counters 44 described in more detail with reference to FIG. 3.

The DCO 18 is connected to the hardware clock 24 via the core PLL 20. The DCO 18 is configured to output a local clock 46 towards the hardware clock 24. The hardware clock 24 is configured to maintain a time-of-day value advancing at a frequency proportional to the local clock frequency of the local clock 46 output by the DCO 18. The core PLL 20 is configured to proportionally change the local clock 46 provided by the DCO 18 to a frequency (e.g., to a higher frequency by multiplying the local clock by a given value) used by the hardware clock 24. The time-of-day value of the hardware clock 24 may be used to provide time values for timestamping performed by the network interface 26.

The time-of-day of the hardware clock 24 may be synchronized to a remote master time-of-day or using any suitable method, for example, PTP. In some cases, the hardware clock 24 may be a master clock for time-of-day for another device. The device 12 may include a pulse per second (PPS) input port 48 and a PPS output port 50 for receiving and sending time-of-day synchronization data, respectively.

The DCO 18 is connected to the network interface 26 via the SerDes PLL 34. The DCO 18 is configured to output the local clock 46 towards the network interface 26. The SerDes PLL 34 is configured to proportionally change the local clock 46 provided by the DCO 18 to a frequency (e.g., to a higher frequency by multiplying the local clock by a given value) used by the network interface 26. The ports 36 of the network interface 26 are configured to send packets over the network 38 at a symbol rate based on a frequency proportional to the local clock frequency.

In some embodiments, the network interface 26 is configured to count symbols received by one or more of the ports 36 and count symbols sent by one or more of the ports 36. Separate counters 42 may be maintained for sent and received symbols per port 36 or a combined counter may be maintained for both sent and received symbols per port 36 so that a difference between symbols sent and received in a time window is tracked by a counter per port 36, for example, by incrementing a counter for received symbols and decrementing that counter for sent symbols, or vice-versa.

The clock synchronization circuitry 22 may be implemented to include the clock chaining logic 28, the firmware controller 30, and the counters 42 of the network interface 26. The values of the counter(s) 42 and/or the counter(s) 44 are exposed to the firmware controller 30 to enable the firmware controller 30 to determine whether the local clock provided by the DCO 18 is faster or slower than a remote master clock, as described in more detail with reference to FIGS. 2 and 3. The firmware running on the firmware controller 30 is configured to generate digital control commands to control the DCO 18 and provide the digital control commands to the DCO 18 via the digital control channel 32. In some embodiments, the firmware controller 30 may be disposed on the network adapter board 14 externally to the network adapter chip(s) 16. In some embodiments, the functionality of the firmware controller 30 may be at least partially implemented using a hardware processor, and/or processor such as a CPU running suitable software in the device 12 or in a peripheral or host device.

In some situations, the remote master clock may be received from one of the remote devices 40 over the network 38. The symbol rate of the data received from that remote device 40 is counted by the network interface 26 using the counters 42. Controlling the DCO 18 based on the remote master clock being received from the remote device 40 is described in more detail with reference to FIG. 2.

In some embodiments, the device 12 may include a peripheral device communication data bus interface (e.g., PCIe interface) (not shown) in addition to, or instead of the network interface 26. The communication data bus interface may be configured to count symbols sent and received over a high-speed link disposed between the device 12 and one of the remote devices 40. The clock synchronization circuitry 22 may be configured to synchronize the local clock 46 generated by the DCO 18 to a remote master clock received from one of the remote devices 40 via the communication data bus interface.

The device 12 may also include a clock input port 56. In some situations, the clock chaining logic 28 may be configured to receive the remote master clock as a clock synchronization signal from a chained device 52 via a clock connection 54 (e.g., a clock cable or PCB trace) connected to the clock input port 56. The DCO 18 may also be connected to the clock chaining logic 28 and be configured to provide the local clock 46 to the clock chaining logic 28. Features (e.g., pulses of the signals or other identifiable sections of the signal waveform such as rising edges of the waveform) of the clock synchronization signal and local clock 46 are counted by the clock chaining logic 28 using the counters 44. As the local clock 46 and the clock synchronization signal may be at different base frequencies, for example, the local clock 46 may be around 156.25 MHz whereas the clock synchronization signal may be around 10 MHz, either the counting method of the features of the local clock 46 and the clock synchronization signal need to be adjusted, and/or the computation of the frequency difference needs to take into account the difference between the base frequencies, or some other method may be employed to equate the differences in the base frequencies. The device 12 may also include a clock output port 60. The clock chaining logic 28 may multiply or divide the local clock 46 by a given factor to yield a clock synchronization signal for output to another chained device 58 via a clock connection 62 (e.g., a clock cable or PCB trace) connected to the clock output port 60. FIG. 1 shows the chained device 52 and the chained device 58 disposed externally to the device 12. In some embodiments, the chained device 52 and/or the chained device 58 may be disposed on the (network adapter) board 14. Adjusting the DCO 18 based on the remote master clock being received from the chained device 52 is described in more detail with reference to FIG. 3.

When the device 12 includes multiple network adapter chips 16, the network interface 26 and the clock synchronization circuitry 22 may be distributed among the multiple chips 16.

In practice, some, or all of these functions of the clock synchronization circuitry 22 may be combined in a single physical component or, alternatively, implemented using multiple physical components. These physical components may comprise hard-wired or programmable devices, or a combination of the two. In some embodiments, at least some of the functions of the clock synchronization circuitry 22 may be carried out by a programmable processor under the control of suitable software. This software may be downloaded to a device in electronic form, over a network, for example. Alternatively, or additionally, the software may be stored in tangible, non-transitory computer-readable storage media, such as optical, magnetic, or electronic memory.

Figure 2:
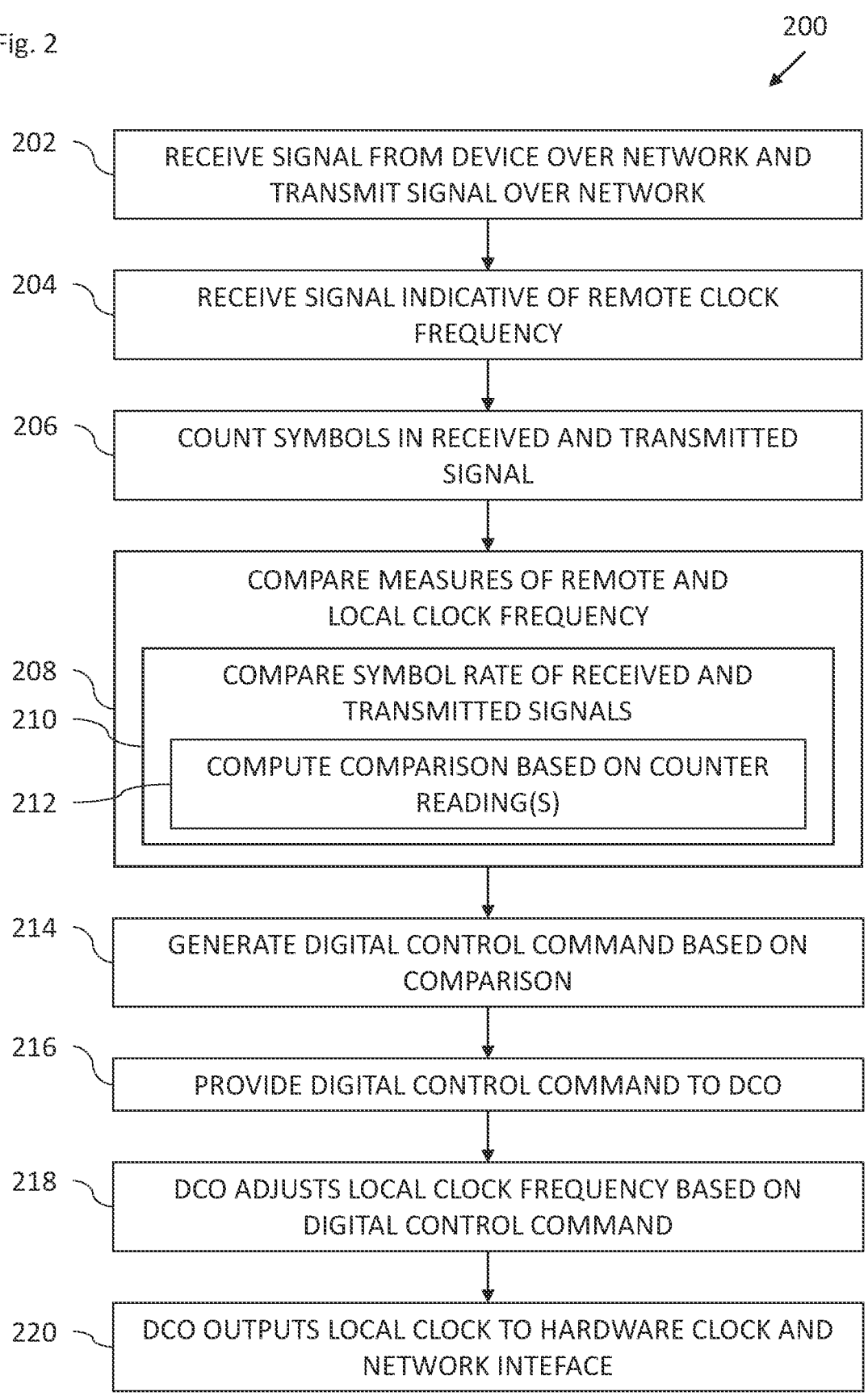
FIG. 2 is a flowchart including steps in a method of operation of the system of FIG. 1 including synchronization to a remote clock frequency received over a network or other high speed communication link.

Reference is now made to FIG. 2, which is a flowchart 200 including steps in a method of operation of the system 10 of FIG. 1 including synchronization to a remote clock frequency received over the network 38 or other high speed communication link. Reference is also made to FIG. 1.

One of the ports 36 (designated as receiving the master clock) of the network interface 26 is configured to receive a signal including data (e.g., first packets) from the device 40 over the network 38 and transmit a signal including data (e.g., second packets) over the network 38 (block 202).

The clock synchronization circuitry 22 is configured to receive the signal from the device 40, the signal being indicative of a remote clock frequency (block 204). In some embodiments, the part of the network interface 26 included in the clock synchronization circuitry 22 is configured to receive from the device 40 the signal indicative of the remote clock frequency (block 204). The data rate, e.g., symbol rate, of the received signal is typically indicative of the remote clock frequency. The remote clock frequency is the frequency of a remote clock which is remote to the local clock 46 generated by the DCO 18. The remote clock may be external to the clock synchronization system 10. The remote clock may be internal to the clock synchronization system 10 but not generated by the DCO 18. For example, the network adapter board 14 may include another DCO which generates the remote clock for example. This latter example may be more relevant to the embodiment of FIG. 3 where the source of the remote clock is from the chained device 52 which may be external to the clock synchronization system 10 or disposed on the network adapter board 14.

In some embodiments, the part of the network interface 26 included in the clock synchronization circuitry 22 is configured to count symbols of the received signal and the transmitted signal in a time window using the counter(s) 42 (block 206). The firmware controller 30 may be configured to send a command to the network interface 26 to initiate counting of the symbols. The symbols of the received signal may be counted on one of the counters 42 and the symbols of the transmitted signal may be counted on another one of the counters 42. In some embodiments, the symbols of the received signal and the transmitted signal may be counted on the same counter 42 such that the counter 42 is incremented for every received symbol and decremented for every transmitted symbol, or vice-versa.

The clock synchronization circuitry 22 is configured to compare measures of the remote clock frequency and the local clock frequency (block 208). In some embodiments, the firmware controller 30 of the clock synchronization circuitry 22 is configured to run firmware to compute the comparison of the remote clock frequency and the local clock frequency.

In some embodiments, the clock synchronization circuitry 22 is configured to compare the symbol rate of the received signal to a symbol rate of the transmitted signal to provide the comparison of the remote clock frequency and the local clock frequency (block 210). In some embodiments, the firmware controller 30 of the clock synchronization circuitry 22 is configured to run the firmware to compute the comparison of the remote clock frequency and the local clock frequency based on the symbol count of the counter(s) 42 (block 212). For example, the comparison may be equal to the difference between the symbol count of received symbols and symbol count of the transmitted symbols in the time window.

The firmware controller 30 of the clock synchronization circuitry 22 is configured to run the firmware to generate a digital control command based on the comparison (block 214). For example, if the symbol count of received symbols is greater than symbol count of the transmitted symbols in the time window, then the remote clock is faster than the local clock and therefore the speed of the local clock should be increased, and vice-versa. The adjustment to the speed of the local clock may be proportional to the difference between the symbol count of received symbols and symbol count of the transmitted symbols in the time window.

In some embodiments, the digital control command indicates a new clock frequency to which to change the local clock frequency by the DCO 18. For example, the digital control command may take the following form: "set your frequency to your initial frequency multiplied by X/Y", where X and Y could be any suitable values such as 100 million plus 1 and 100 million, or 100 billion plus 1 and 100 billion. The interface may also be a single number, which multiplies the initial frequency, such as 1.00000001.

In some embodiments, the digital control command indicates a frequency adjustment to be made by the DCO 18 to the local clock frequency. For example, if the current frequency of the local clock 46 is 156.25 MHz and the local clock 46 is slow by 1 Hz, the digital control command may indicate that the new clock frequency should be increased by 1 Hz.

The firmware controller 30 is configured to provide the digital control command to the DCO 18 via the digital control channel 32 (block 216). The DCO 18 is configured to adjust the local clock frequency responsively to the digital control command received from the firmware controller 30 (block 218). The DCO 18 is configured to output the local clock 46 towards the hardware clock 24 and the network interface 26 via the core PLL 20 and the SerDes PLL 34, respectively (block 220).

Reference is now made to FIG. 3, which is a flowchart 300 including steps in a method of operation of the system 10 of FIG. 1 including synchronization to a remote clock frequency received from the chained device 52. Reference is also made to FIG. 1.

The clock input port 56 is configured to receive a first clock synchronization signal via clock connection 54 from chained device 52 (block 302). The clock chaining logic 28 is configured to receive the first clock synchronization signal from the clock input port 56 (block 304). The first clock synchronization signal is indicative of the remote clock frequency of the clock running on the chained device 52. The first clock synchronization signal is generally an analogue signal having a frequency proportional to the frequency of the clock running on the chained device 52. For example, the clock running on the chained device 52 may have a frequency around 156.25 MHz, while the clock synchronization signal has a frequency around 10 MHz. The remote clock frequency is the frequency of a remote clock which is remote to local clock generated by the DCO 18. The remote clock may be external to the clock synchronization system 10. The remote clock may be internal to the clock synchronization system 10 but not generated by the DCO 18. For example, the network adapter board 14 may include chained device 52 which includes another DCO which generates the remote clock.

In some embodiments, the clock chaining logic 28 is configured to count features of the received first clock synchronization signal and the local clock 46 in a time window using the counter(s) 44 (block 306). The features may include pulses of the signals or other identifiable sections of the signal waveform, e.g., rising edges of the waveform. The firmware controller 30 may be configured to send a command to the clock chaining logic 28 to initiate counting of the features. The features of the received first clock synchronization signal may be counted on one of the counters 44 and the features of the local clock 46 may be counted on another one of the counters 44. In some embodiments, the features of the first clock synchronization signal and the local clock 46 may be counted on the same counter 42 such that the counter 44 is incremented for every feature of the first clock synchronization signal and decremented for every feature of the local clock 46 (assuming the signals have compatible frequencies), or vice-versa.

The clock synchronization circuitry 22 is configured to compare measures of the remote clock frequency and the local clock frequency (block 308). In some embodiments, the firmware controller 30 of the clock synchronization circuitry 22 is configured to run firmware to compute the comparison of the remote clock frequency and the local clock frequency. In some embodiments, the clock synchronization circuitry 22 is configured to compare a number of features of the first clock synchronization signal to a number of features of the local clock 46 to provide the comparison of the remote clock frequency and the local clock frequency (block 310). In some embodiments, the firmware controller 30 of the clock synchronization circuitry 22 is configured to run the firmware to compute the comparison of the remote clock frequency and the local clock frequency based on the count value(s) of the counter(s) 44 (block 312). For example, the comparison may be equal to the difference between the feature count of the first clock synchronization signal and the feature count of the local clock 46 in the time window.

The firmware controller 30 of the clock synchronization circuitry 22 is configured to run the firmware to generate a digital control command based on the comparison (block 314). For example, if the feature count of the first clock synchronization signal is greater than the feature count of the local clock 46 in the time window, then the remote clock (as indicated by the first clock synchronization signal) is faster than the local clock 46 and therefore the speed of the local clock 46 should be increased. The adjustment to the speed of the local clock 46 may be proportional to the difference between the feature count of the first clock synchronization signal and the feature count of the local clock 46 in the time window.

In some embodiments, the digital control command indicates a new clock frequency to which to change the local clock frequency by the DCO 18. For example, the digital control command may take the following form: "set your frequency to your initial frequency multiplied by X/Y", where X and Y could be any suitable values such as 100 million plus 1 and 100 million, or 100 billion plus 1 and 100 billion. The interface may also be a single number, which multiplies the initial frequency, such as 1.00000001.

In some embodiments, the digital control command indicates a frequency adjustment to be made by the DCO 18 to the local clock frequency. For example, if the current frequency of the local clock 46 is 156.25 MHz and the local clock 46 is slow by 1 Hz, the digital control command may indicate that the new clock frequency should be increased by 1 Hz.

The firmware controller 30 is configured to provide the digital control command to the DCO 18 via the digital control channel 32 (block 316). The DCO 18 is configured to adjust the local clock frequency responsively to the digital control command received from the firmware controller 30 (block 318). The DCO 18 is configured to output the local clock 46 towards the hardware clock 24 and the network interface 26 via the core PLL 20 and the SerDes PLL 34, respectively (block 320).

The clock chaining logic 28 may be configured to: proportionally change (e.g., step up or step down but with a constant proportion of the base frequency of the local clock 46) a frequency of the local clock 46 to yield a second clock synchronization signal; and provide the second clock synchronization signal to the clock output port 60 for output to the chained device 58 via the clock connection 62 (clock 322). The clock output port 60 is configured to provide the second clock synchronization signal to the chained device 58 via the clock connection 62.

Various features of the invention which are, for clarity, described in the contexts of separate embodiments may also be provided in combination in a single embodiment. Conversely, various features of the invention which are, for brevity, described in the context of a single embodiment may also be provided separately or in any suitable sub-combination.

The embodiments described above are cited by way of example, and the present invention is not limited by what has been particularly shown and described hereinabove. Rather the scope of the invention includes both combinations and sub-combinations of the various features described hereinabove, as well as variations and modifications thereof which would occur to persons skilled in the art upon reading the foregoing description and which are not disclosed in the prior art.

What is claimed is:

1. A system, comprising:
   a digitally controlled oscillator (DCO) to generate a local clock having a local clock frequency; and
   clock synchronization circuitry to:
   receive from a device a signal indicative of a remote clock frequency;
   compare measures of the remote clock frequency and the local clock frequency;
   generate a digital control command based on the comparison; and
   provide the digital control command to the DCO, wherein the DCO is to adjust the local clock frequency responsively to the digital control command.

2. The system according to claim 1, wherein digital control command indicates a new clock frequency to which to change the local clock frequency by the DCO.

3. The system according to claim 1, wherein digital control command indicates a frequency adjustment to be made by the DCO to the local clock frequency.

4. The system according to claim 1, further comprising:
   a network interface to receive the signal including first packets from the device over a network and transmit a signal including second packets over the network;
   the clock synchronization circuitry is to compare a symbol rate of the received signal to a symbol rate of the transmitted signal to provide the comparison of the remote clock frequency and the local clock frequency.

5. The system according to claim 4, further comprising multiple chips, wherein the network interface and the clock synchronization circuitry are distributed among the multiple chips.

6. The system according to claim 4, wherein the clock synchronization circuitry includes at least one counter in which the clock synchronization circuitry is to count symbols of the received signal and the transmitted signal in a time window, the clock synchronization circuitry is to run firmware to compute the comparison of the remote clock frequency and the local clock frequency based on at least one symbol count of the at least one counter.

7. The system according to claim 1, further comprising a clock input port to receive the signal from the device via a clock connection, the clock synchronization circuitry is configured to compare features of the received signal and the local clock to provide the comparison of the remote clock frequency and the local clock frequency.

8. The system according to claim 7, wherein the clock synchronization circuitry includes clock chaining logic which includes at least one counter in which the clock chaining logic is to count the features of the received signal and the local clock in a time window, the clock synchronization circuitry being to run firmware to compute the comparison of the remote clock frequency and the local clock frequency based on at least one count value of the at least one counter.

9. The system according to claim 7, further comprising a clock output port to provide a clock synchronization signal to another device via another clock connection.

10. The system according to claim 9, wherein the clock chaining logic is to:
    proportionally change a frequency of the local clock to yield the clock synchronization signal; and
    provide the clock synchronization signal to the clock output port for output to the other device via the other clock connection.

11. The system according to claim 1, wherein clock synchronization circuitry is to run firmware to compute the comparison of the remote clock frequency and the local clock frequency.

12. The system according to claim 1, further comprising a hardware clock to maintain a time-of-day value advancing at a frequency proportional to the local clock frequency of the local clock output by the DCO, wherein the DCO is connected to the hardware clock and is to output the local clock towards the hardware clock.

13. The system according to claim 1, further comprising a network interface including ports to send packets over a network at a symbol rate based on a frequency proportional to the local clock frequency, wherein DCO is connected to the network interface and is to output the local clock towards the network interface.

14. A method, comprising:
    generating a local clock having a local clock frequency with a digitally controlled oscillator (DCO);
    receiving from a device a signal indicative of a remote clock frequency;
    comparing measures of the remote clock frequency and the local clock frequency;
    generating a digital control command based on the comparison; and
    provide the digital control command to the DCO; and
    adjusting the local clock frequency by the DCO responsively to the digital control command.

15. The method according to claim 14, wherein digital control command indicates a new clock frequency to which to change the local clock frequency by the DCO.

16. The method according to claim 14, wherein digital control command indicates a frequency adjustment to be made by the DCO to the local clock frequency.

17. The method according to claim 14, wherein:
    the receiving includes receiving the signal including first packets from the device over a network, the method further comprising transmitting a signal including second packets over the network;
    the comparing includes comparing a symbol rate of the received signal to a symbol rate of the transmitted signal to provide the comparison of the remote clock frequency and the local clock frequency.

18. The method according to claim 17, further comprising:
    counting symbols of the received signal and the transmitted signal in a time window using at least one counter; and running firmware to compute the comparison of the remote clock frequency and the local clock frequency based on at least one symbol count of the at least one counter.

19. The method according to claim 14, wherein:
the receiving includes receiving the signal from the device via a clock connection; and
the comparing includes comparing features of the received signal and the local clock to provide the comparison of the remote clock frequency and the local clock frequency.

20. The method according to claim 19, further comprising:
counting the features of the received signal and the local clock in a time window using at least one counter; and
running firmware to compute the comparison of the remote clock frequency and the local clock frequency based on at least one count value of the at least one counter.

21. The method according to claim 19, further comprising providing a clock synchronization signal to another device via another clock connection.

22. The method according to claim 21, further comprising proportionally changing a frequency of the local clock to yield the clock synchronization signal.

23. The method according to claim 14, further comprising running firmware to compute the comparison of the remote clock frequency and the local clock frequency.

24. The method according to claim 14, further comprising maintaining a time-of-day value advancing at a frequency proportional to the local clock frequency of the local clock output by the DCO.

25. The method according to claim 14, further comprising sending packets over a network at a symbol rate based on a frequency proportional to the local clock frequency of the local clock output by the DCO.

* * * * *